United States Patent [19]
Nestlerode

[11] Patent Number: 6,163,238
[45] Date of Patent: Dec. 19, 2000

[54] FAST VARIABLE RF NETWORK INDUCTOR

[75] Inventor: C. Dale Nestlerode, Fullerton, Calif.

[73] Assignee: Raytheon Company, Lexington, Mass.

[21] Appl. No.: 07/045,915

[22] Filed: May 1, 1987

[51] Int. Cl.[7] .................................................. H03J 3/20
[52] U.S. Cl. .............................. 334/56; 334/77; 333/32
[58] Field of Search ................................ 334/56, 60, 64, 334/69, 70, 76, 77; 343/745, 750; 455/192, 193; 307/129, 259; 333/32

[56] References Cited

U.S. PATENT DOCUMENTS

| | | | |
|---|---|---|---|
| 4,072,900 | 2/1978 | Ray | 325/67 |
| 4,339,827 | 7/1982 | Torres et al. | 455/188 |
| 4,361,909 | 11/1982 | Theriault | 455/286 |
| 4,367,557 | 1/1983 | Stern et al. | 455/4 |
| 4,461,032 | 7/1984 | Skerlos | 455/4 |
| 4,502,025 | 2/1985 | Carl, Jr. et al. | 334/56 |
| 4,564,843 | 1/1986 | Cooper | 343/745 |

*Primary Examiner*—Gregory C. Issing
*Attorney, Agent, or Firm*—Colin M. Raufer; Glenn H. Lenzen, Jr.

[57] ABSTRACT

A variable RF inductor network having a plurality of coaxial cables with their respective outer conductors in electrical contact with each other, thereby forming a common outer conductor. This common outer conductor is connected to an RF ground and an RF source. An RF choke is formed between the RF ground and RF source by winding the coaxial cables around a first of a series of inductor cores. The coaxial cables are then wound serially about the remaining succession of inductor cores to form serial, separate inductors. At each separate inductor core, one of the cables is terminated and the inner conductor of the terminated cable is connected to a PIN diode switch for switching the particular inductor out of the network by shorting the common outer conductor across the core. The inner conductors are connected to a biasing means for individually controlling each PIN diode switch to selectively switch particular inductors in and out of the network.

19 Claims, 2 Drawing Sheets

FAST VARIABLE RF NETWORK INDUCTOR

TECHNICAL FIELD

The subject invention relates to the technical field of communications.

BACKGROUND OF THE INVENTION

1. Field of the Invention

The subject invention relates to tunable RF networks and, more particularly, to apparatus for rapidly switching selected inductors in and out of a series network of such inductors.

2. Description of Related Art

The need has arisen for a variable RF inductor having no moving parts for use in an antenna matching network for matching signals in the 2 to 30 MHz HF range and subject to RF voltages on the order of three kilo-volts. It is further desirable that such an inductor be controllable by binary switching signals compatible with computer control at high speed. Theoretically, such an inductor may be constructed of a series connection of binary incremental inductor values of the required range and resolution with shorting switches used to remove unwanted inductive elements. Such switches must have low "ON" resistance and low "OFF" capacitance to avoid detuning of the RF circuit and power losses. PIN diodes meet these requirements but need a DC forward bias circuit to provide DC current for turn-on and a DC back bias voltage for turn-off.

Providing the appropriate switching signals for turning the PIN diodes "on" and "off" is not a straightforward matter because the DC bias circuit is also a path for shunting RF currents to ground. The resulting capacitive and resistive loading also causes unwanted RF losses and detuning of the RF network. An RF choke placed in each of the DC bias lines to the diode switches could theoretically provide the required RF isolation; however, the design of an RF choke that maintains a high impedance over the 2 to 30 MHz HF radio band is not practical. In addition, with voltages on the order of 3 kilovolts applied to the RF choke, the choke must have a very high impedance to minimize RF losses due to RF currents through its lossy elements.

In order to eliminate the foregoing problems, other workers in this field have proposed constructing the inductor windings using a tubular conductor with the control wires for PIN switches inside. The control wires then emerge from holes in the wall of the tubing where needed to control the PIN switch. Although conceptually simple, this construction is difficult to make. Extracting numerous control wires through the tubing and bringing them out small holes in the tubing wall is not a practical task in production. Thus, paralleling of multiple control wires with the inductor and choke windings is physically difficult to implement in a producible form.

SUMMARY OF THE INVENTION

It is therefore an object of the invention to provide an improved tunable RF network.

It is another object of the invention to provide a variable inductor for RF applications having no moving parts and controllable by binary switching signals.

It is another object of the invention to provide such a variable inductor for use in an antenna matching network for matching signals in the 2 to 30 MHz range and subject to voltages on the order of 3 kilovolts.

It is another object of the invention to employ PIN diode switching devices in a variable RF inductor while avoiding RF losses and detuning of the RF network.

It is yet another object of the invention to provide a variable RF inductor employing PIN switching devices which is more easily and accurately manufactured than prior devices.

These and other objects and advantages are achieved by winding a succession of cores serially with a plurality of coaxial cables, each having an exposed exterior conductor and an interior conductor. The exposed exterior conductors are electrically joined and collectively form an outer conductor, which serves as the conductor for the inductive windings. Prior to entering the first core, which serves as an RF choke, the outer conductor is connected to RF ground, and the interior conductors are connected to respective DC control inputs. After exiting the RF choke core, the outer conductor is connected to the RF source. The windings on the cores beyond the RF choke core serve as tuning network inductors. To facilitate tuning, one coaxial cable is terminated prior to entering a selected core. The inner conductor of the terminated cable is connected to control a switch. When activated, the switch provides an RF short circuit across the selected inductor, removing the selected inductor from the network. Similar cable terminations and switch connections at succeeding cores provide a variable inductance RF network.

BRIEF DESCRIPTION OF THE DRAWING

The just summarized invention will now be described in conjunction with the drawings of which.

DETAILED DESCRIPTION OF THE PREFERRED EMBODIMENT

Figure 1:
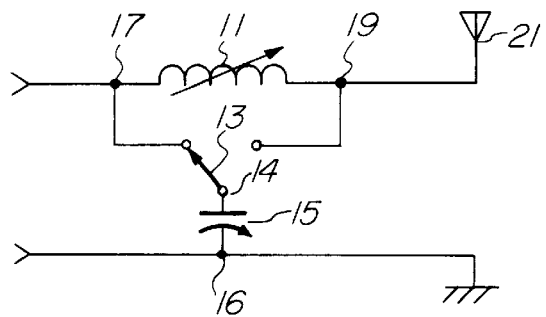
FIG. 1 is a circuit schematic of a typical RF network application wherein the preferred embodiment finds use.

FIG. 1 shows a typical application for a tunable RF network requiring a variable inductor 11. The network includes a switch 13 connecting a first terminal 14 of a variable capacitor 15 to either terminal 17 or 19 of the inductor 11. The second terminal 16 of the capacitor 15 is connected to ground. The RF input to the network is provided across the first inductor terminal 17 and ground.

An antenna 21 is connected to the other inductor terminal 19. The antenna provides a variable complex impedance vs. frequency. In order to match this variable complex impedance to a 50 ohm resistive source over a frequency range of 2–30 MHZ, the variable inductance 11 and switchable variable capacitor 15 are necessary. For example, at lower frequencies, the antenna has a large series reactance, e.g. 1700 ohms with 7 ohms of resistance. At such frequencies the series inductance may be adjusted to cancel the reactance. The 7 ohms of resistance must then be matched by a series inductance and a shunt capacitance at the input side of the tuning network. As the frequency increases, the reactive component of the antenna 21 decreases to a point, e.g. 100 ohms, where capacitance must be added from terminal 19 to ground.

Figure 2:
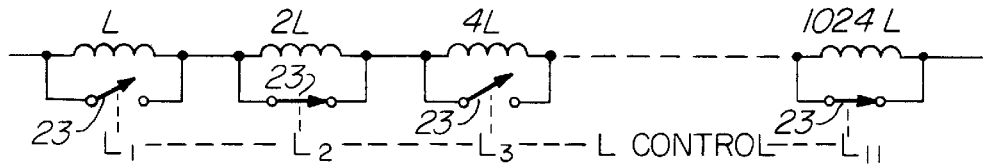
FIG. 2 is a circuit schematic of a series network of binary incremental inductor values.

An implementation of a variable inductor 11 having no moving parts and controllable by binary switching signals is shown in FIG. 2. In FIG. 2, a series connection of binary incremental inductor values L, 2L, 4L . . . 1024L, provide the required range and resolution. Shorting switches 23 are used to remove an unwanted inductive element from the network to select the desired inductor value. These switches 23 must have low "ON" resistance and low "OFF" capacitance. PIN diodes meet these requirements but require a DC current for turn-on and DC back bias voltage for turn-off.

Figure 3:
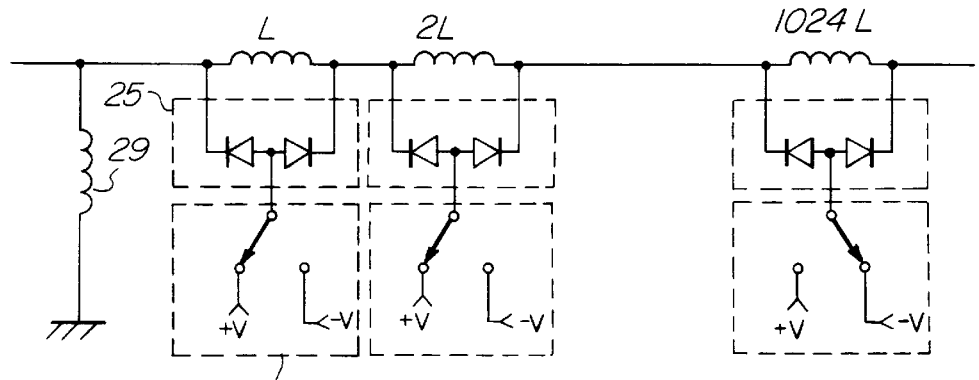
FIG. 3 is a circuit schematic of a variable inductor network employing PIN diode switches.

FIG. 3 illustrates how PIN diode switches 25 might be connected to RF inductor elements L, 2L, 4L . . . 1024L, and to the DC bias circuits 27, providing a forward bias voltage +V and reverse bias voltage -V. The forward bias current is returned to ground via the DC path through the inductors L, 2L . . . 1024L and the RF choke 29. The circuit of FIG. 3 is not usable as shown because the DC bias circuits 27 constitute paths for RF losses and detuning of the RF network. An RF choke, similar to 29, placed in each of the DC bias lines to the diode switches 25 could theoretically provide the required RF isolation; however, the design of an RF choke that maintains a high impedance over the 2 to 30 MHz HF radio band is not practical. Adding to the problem is the existence of RF voltages over three kilovolts. With such high voltages applied to the RF choke, the choke must have a very high impedance to minimize RF losses due to RF currents through the lossy elements of the broadband choke. The design of the RF choke 29 at the input end of the network is not impractical, however, because of the low impedance and low RF voltage at this point in the network.

Figure 4:
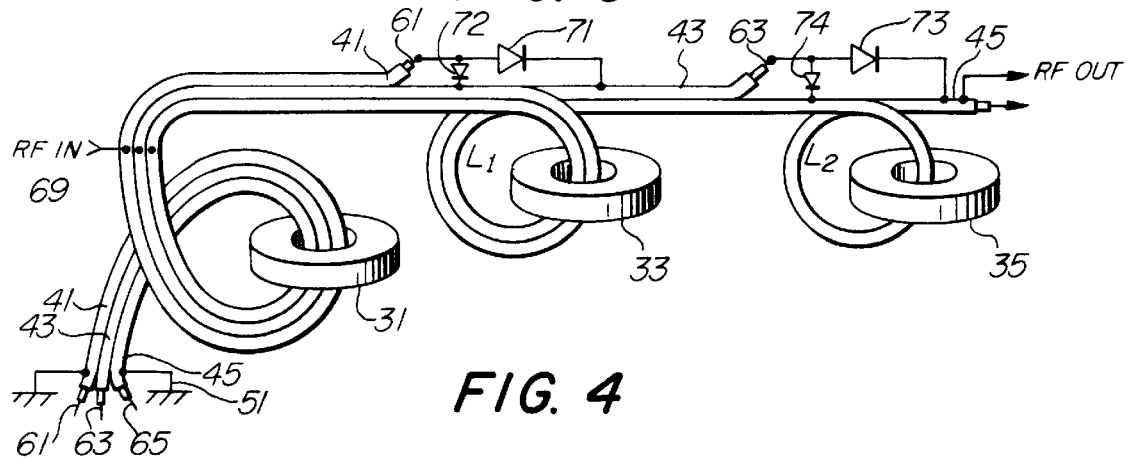
FIG. 4 is a simplified pictorial drawing illustrating the preferred embodiment of the invention.

The preferred embodiment of a readily manufacturable, digitally controllable variable inductor circuit which avoids the foregoing problems is shown in FIG. 4. The circuit of FIG. 4 employs a number of toroidal cores 31, 33, 35 and a number of miniature coaxial cables 41, 43, 45. Each miniature coaxial cable 41, 43, 45 has a solid bare copper outer conductor, a solid copper inner conductor, and a solid Teflon insulation or dielectric disposed between the inner and outer conductors.

The preferred cable is known as ultramalleable, semi-rigid coaxial cable and is available in subminiature outer diameter sizes of 0.508 mm (0.020 inches) and 0.864 mm (0.034 inches) from Uniform Tubes, Inc., 200 W. 7th Avenue, Collegeville, Pa. The ultramalleable cable handles like copper magnet wire and is wound on the toroidal cores 31, 33, 35 with a standard toroidal coil winder. The coax outer conductors are then soldered together on either side of each core 31, 33, 35, thereby shorting the outer conductors together to form a single inductor winding conductor.

The first toroidal core 31 and the winding formed by the cables 41, 43, 45 form an RF choke. The second core 33 and second and third cables 43, 45 form a first inductor, while the third core 35 and the third cable 45 form a second inductor. In practice, of course, sufficient turns are wound on each inductor core 33, 35 and the characteristics of the core are selected to give the desired inductance value.

An RF input 69 is applied to the shorted together outer conductors of the coaxial cables 41, 43, 45 between the first and second toroidal cores 31, 33. On the side of the first toroidal core 31 opposite the RF input connection 69, the shorted together outer conductors of the coaxial cables 41, 43, 45 are each connected to an RF ground 51, and the inner conductors 61, 63, 65 are exposed and connected to suitable control inputs for controlling associated PIN diode switches 71, 72, 73, 74. In practice, additional cables like cables 41, 43, 45, are typically used to provide additional network inductors and related control lines.

At each successive inductor core 33, 35, a respective cable 41, 43 is terminated and the center conductor 61, 63 is exposed. A first PIN diode switch including first and second PIN diodes 71, 72 is connected to the first exposed center conductor 61 and to the exterior conductor 43 at each end of the inductor winding such that when the PIN diodes 71 and 72 are conducting, the first inductor L1 is short-circuited out of the RF network. Similarly, the second PIN diode switch including PIN diodes 73, 74 is connected from the exposed center conductor 63 of the second cable 43 to the exterior conductor 45 at each end of the second inductor L2. Additional inductor cores and cables may be added to extend the network, with one of the cables being terminated at each core and connected to a PIN diode switch.

According to the preferred embodiment of FIG. 4, the number of RF chokes is reduced to one, placed at a low impedance point of the RF network, and control wires from each inductor shorting switch are run in parallel with the series string of inductor windings back to the low impedance (vs. RF ground) end of the variable inductor. The control wires then come out of the RF network at an RF ground potential by running parallel to the windings of the choke.

Figure 5:
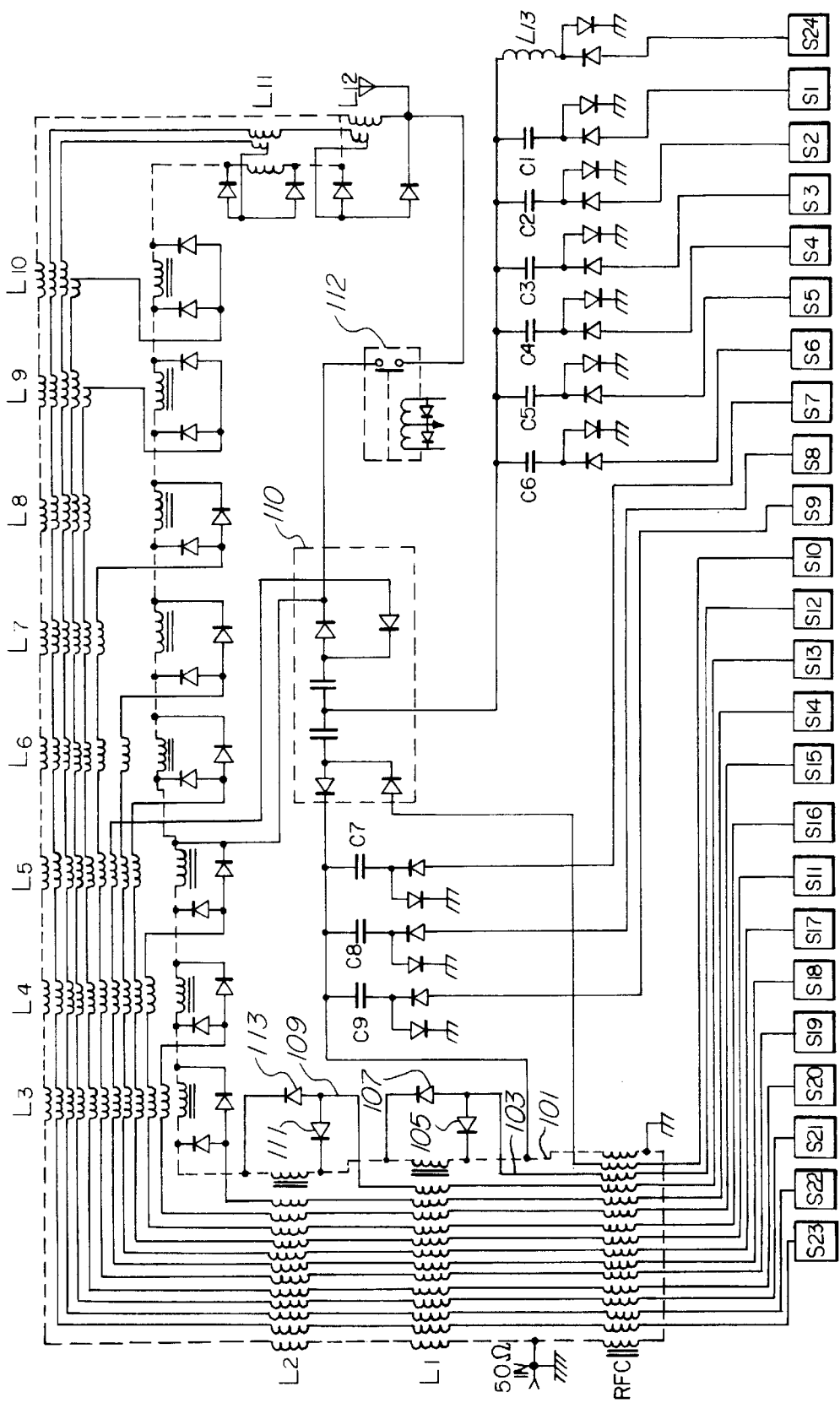
FIG. 5 is a circuit schematic incorporating the preferred embodiment of the invention.

FIG. 5 illustrates the use of the preferred embodiment in a matching circuit such as that shown in FIG. 1. In the embodiment of FIG. 5, the inductors L1, L2, L3 . . . L10, have values which successively double, e.g., 0.05 µH, 0.1 µH, 0.2 µH . . . 25.6 µH. Inductors L11 and L12 each have an inductance of 25.6 µH and are used together to provide the final network inductor value, 51.2 µH (1024×L1). The outer conductors of all of the coaxial cables are represented by the phantom line 101 in FIG. 5, which is also D.C. ground.

A first one of the coaxial conductors 103 has its inner conductor connected to respective PIN diodes 105, 107 at the first inductor L1. Each of these PIN diodes 105, 107 is connected to the outer conductor 101 (D.C. ground) on either side of the inductor L1. At the second inductor L2, the next successive cable terminates and its inner conductor 109 is connected to respective PIN diodes 111, 113 whose cathodes are again connected to the outer conductor 101 at each end of the inductor L2. This dual diode shorting structure is repeated for each successive cable at each successive inductor L3, L4 . . . L10, L11, L12. Each PIN diode switch pair, e.g. 111, 113 is controlled, i.e., back biased or forward biased, by a respective switch S12 . . . S23.

It may be noted that the first diodes 105, 111 etc., are provided to insure that the inner and outer conductors 101, 103, 101, 109 are at the same RF potential. A capacitor was also tried for this purpose but its charging time proved too long. Both diodes, e.g., 105, 107 when turned on, become an RF short across the associated coil, e.g., L1.

The remainder of the circuitry in FIG. 5 is concerned with providing the variable switch 13 for the capacitor 15 illustrated in FIG. 1, and will be briefly described. Three capacitors C7, C8, and C9 are arranged to be switched in and out of the RF network as capacitive shunts to ground by respective PIN switches. These capacitors have binary related values, e.g., 2720, 1360 and 680 picofarads (pf). A parallel capacitor network including capacitors C1, C2 . . . C6 is connected through a single pole double throw (SPDT) switch 110 either to the RF input or to the RF junction between inductors L5 and L6 by means of control voltages applied by switches S10 and S11. The large value capacitors C7, C8, C9 are not switched by the switch 110 because they are not used at the higher frequencies where the capacitance to ground is needed at the output side of the RF network. This reduces stray capacitance in the parallel capacitor.

The variable capacitor to ground 15 of FIG. 1, is thus provided by switching in binary capacitor values C1 through C9 by means of control signals from S1 through S9. A relay 112 is used at high frequencies to provide an additional shunt path around the already shorted out inductors L6 through L12 in order to achieve the low network inductance required. The switching capability provided by the SPDT switch 110 and relay 112 reduces stray impedance effects. It further prevents the switches from handling the high antenna voltage at the low end of the frequency band. Only the first five inductances are used when the matching network is in a step-down mode. The inductance L13, controlled by switch S24, is used to resonate out the stray capacitance of the parallel capacitor network at certain frequencies where minimum shunt capacitance is required.

The preferred construction of the incremental inductors is a winding on an iron powder toroidal core. Such construction provides maximum Q in the smallest size and has minimal external fields, allowing close proximity of other coils with minimal interaction. In embodiments such as FIG. 5, it may also prove necessary to employ varying wire gauges to withstand the back bias across the conductors, which, for large inductors, may be on the order of one thousand volts.

The preferred embodiment thus provides a commercially producible, electronically variable RF network inductor using a series string of incremental inductive elements (coils) with a PIN diode shorting switch across each element. Winding the coils with a conductor that consists of a bundle of miniature coaxial cables, one terminating at each PIN diode switch, provides multiple DC paths (the coax center conductors) for control signals through the RF network, minimizing undesired loading or detuning effects in conducting a DC control signal to its respective diode switch.

As a result of the preferred structure, PIN diode switches can be placed anywhere in the RF network with negligible undesired loading or stray capacitive or inductive effects. The coil construction is also practical for production, using multiple passes on a toroidal winding machine.

In the case of the coils located closer to the antenna such as L9 and L10, the coax center conductor which provides diode control is taken from a point approximately one-half way around the toroidal core as shown in the embodiment of FIG. 5. Large voltages (such as 2000V rf) can be present at these inductors and by using the control center conductor at a one-half point in the inductor, the high voltage is split between the diodes rather than having the whole voltage on one diode.

This permits the use of lower voltage diodes which are more readily available.

As will be apparent to those skilled in the art, the just described preferred embodiment admits of numerous modifications and adaptations without departing from the scope of the invention. For example, and without limitation, a varying number of inductor cores and various inductance values may be provided to accommodate various frequency ranges and other design parameters. Therefore, it is to be understood that, the invention may be practiced other than as specifically described herein and still be within the scope of the appended claims.

What is claimed is:

1. An RF variable inductance network comprising:
   a plurality of inductor cores;
   a plurality of coaxial cables, each including an inner conductor, an outer conductor and an insulator separating the inner and outer conductors, said plurality of coaxial cables being disposed in a parallel configuration with one another with said outer conductors being in electrical contact with one another, said coaxial cables being wound around said plurality of inductor cores serially, thereby forming separate serial inductances;
   RF means for coupling RF energy to said outer conductors;
   and respective ones of said coaxial cables being terminated at a predetermined position in relation to respective ones of said cores; and
   switching means for selectively shorting across the wound inductor cores in response to control signals conducted by the inner conductors of the terminated coaxial cables by connecting the respective outer conductors of the terminated coaxial cables to an outer conductor of a coaxial cable located across the respective inductor core from the terminated coaxial cable.

2. The variable inductance network of claim 1 wherein said cores comprise toroidal cores.

3. The variable inductance network of claim 1 wherein said switching means comprises a plurality of switching diodes, each being connected between the inner conductor of the terminated coaxial cable and the outer conductor of another coaxial cable, the inner conductor of the terminated coaxial cable being coupled to a biasing means for providing biasing energy to said diodes, and said outer conductor of said another coaxial cable being coupled to a return for said biasing means.

4. The variable inductance network of claim 3 wherein said switching diodes comprise PIN switching diodes.

5. The variable inductance network of claim 1 further including an RF ground and an RF choke inductor core wherein the outer conductors connect at a first end of said cables to said RF ground, and wherein said cables are wound about said RF choke core between said RF ground and the first of said plurality of inductor cores; and
   said RF means couples said RF energy between said choke core and said first of said plurality of inductor cores.

6. The variable inductance network of claim 5 wherein said switching means includes:
   a switching diode means connected to each of said inner conductors at the respective cable termination and the outer conductor of another coaxial cable across the respective inductor and being responsive to a short circuit control signal for short circuiting inductance of the respective inductor.

7. The variable inductance network of claim 1 wherein said switching means includes a pair of first and second diodes located at each of said wound inductor cores, each diode having a cathode and an anode, the anodes being connected in common with the inner conductor of the terminated coaxial cable and the cathode of the first diode being connected to the outer conductor of the terminated coaxial cable, and the cathode of the second diode being connected to an outer conductor across said core from the terminated coaxial cable.

8. The variable inductance network of claim 7 wherein said diodes comprise PIN diodes.

9. An inductor network for connection to an RF source, the network providing variable inductance by the shorting of inductor increments which are connected in series, comprising:
   a D.C. ground;
   a plurality of inductor core means;
   a plurality of switch means;

a plurality of coaxial cables, each comprising an inner conductor and an outer conductor, and being separated from each other by a dielectric;

the outer conductors for connection to said RF ground and RF source, the plurality of outer conductors being in common electrical contact with one another to form a common conductor;

the plurality of inner conductors and plurality of outer conductors forming a continuous cable wound at intervals about each said inductor core means to form a plurality of inductors, an inner conductor being terminated to form a connection point at a predetermined position in relation to said inductor core means; and switch means connected to said common conductor on either side of at least one of said inductor core means and to said connection point, said switch means being responsive to control signals applied to said connection point for selectively shorting the inductor formed on said at least one inductor core means out of said network.

10. The inductor network of claim 9 wherein a said inner conductor is terminated adjacent each respective one of said plurality of said inductor core means to form a connection point at each of said plurality of inductor core means and wherein a switch means is connected to each of said connection points for selectively shorting the inductor formed on the respective inductor core means out of said network.

11. The inductor network of claim 10 wherein each said inductor core means comprises a toroidal core.

12. The inductor network of claim 10 wherein each said switch means includes a PIN diode.

13. The inductor network of claim 10 wherein each said switch means includes a pair of first and second diodes located at each of said wound inductor cores, each diode having a cathode and an anode, the anodes being connected in common to a respective said connection point and the cathode of the first diode being connected to said common conductor on the side of the respective inductor core means where said inner cable is terminated and the cathode of the second diode being connected to said common conductor on the opposite side of said respective inductor core means.

14. The inductor network of claim 10 further including an RF choke core means about which said cable is wound between said RF source and RF ground and prior to winding of said cable about the first of said inductor core means.

15. The inductor network of claim 9 wherein a said inner conductor is terminated at approximately a one-half way position on selected respective ones of said plurality of said inductor core means to form a connection point at said selected ones of said plurality of inductor core means and wherein said switch means is connected to each of said connection points for selectively shorting the inductor formed on the respective inductor core means out of said network.

16. The inductor network of claim 15 wherein each said switch means includes a PIN diode.

17. The inductor network of claim 15 wherein each said switch means includes first and second diodes each diode of each pair having a cathode and an anode, the anodes of each pair being connected to a respective said connection point and the cathode of the first diode of said pair being connected to said common conductor on one side of the respective inductor core means and the cathode of the second diode being connected to said common conductor on the opposite side of said respective inductor core means.

18. The inductor network of claim 17 further including an RF choke core means about which said cable is wound between said RF source and RF ground and prior to winding of said cable about the first of said inductor core means.

19. The inductor network of claim 18 wherein each said inductor core means comprises a toroidal core.

* * * * *